United States Patent
Nakahata et al.

(10) Patent No.: US 6,710,513 B2
(45) Date of Patent: Mar. 23, 2004

(54) SURFACE ACOUSTIC WAVE DEVICE AND SUBSTRATE THEREOF

(75) Inventors: Hideaki Nakahata, Itami (JP); Akihiro Hachigo, Itami (JP); Natsuo Tatsumi, Itami (JP); Takahiro Imai, Itami (JP); Shinichi Shikata, Itami (JP)

(73) Assignee: Seiko Epson Corporation, Nagano-ken (JP)

( * ) Notice: Subject to any disclaimer, the term of this patent is extended or adjusted under 35 U.S.C. 154(b) by 19 days.

(21) Appl. No.: 10/203,423

(22) PCT Filed: May 25, 2001

(86) PCT No.: PCT/JP01/04431

§ 371 (c)(1), (2), (4) Date: Aug. 8, 2002

(87) PCT Pub. No.: WO02/13381

PCT Pub. Date: Feb. 14, 2002

(65) Prior Publication Data

US 2003/0011280 A1 Jan. 16, 2003

(30) Foreign Application Priority Data

Aug. 9, 2000 (JP) ........................................ 2000-241468

(51) Int. Cl.$^7$ ................................................ H03H 9/25
(52) U.S. Cl. .................................................. 310/313 A
(58) Field of Search ..................................... 310/313 A (56) References Cited

U.S. PATENT DOCUMENTS

| | | | |
|---|---|---|---|
| 5,320,865 A | * | 6/1994 | Nakahata et al. ........... 427/100 |
| 5,440,189 A | * | 8/1995 | Nakahata et al. ....... 310/313 R |
| 5,446,329 A | | 8/1995 | Nakahata et al. ....... 310/313 A |
| 5,565,725 A | | 10/1996 | Nakahata et al. ....... 310/313 A |
| 5,646,468 A | | 7/1997 | Nakahata et al. ....... 310/313 A |
| 5,777,422 A | * | 7/1998 | Kitabayashi et al. .... 310/313 A |
| 5,838,089 A | * | 11/1998 | Dreifus et al. .......... 310/313 A |
| 5,838,090 A | | 11/1998 | Nakahata et al. ....... 310/313 A |
| 2003/0022412 A1 | * | 1/2003 | Higgins et al. ................ 438/50 |

FOREIGN PATENT DOCUMENTS

| | | | |
|---|---|---|---|
| EP | 0674386 A1 | 9/1995 | ............ H03H/9/02 |
| JP | 5-37284 | 2/1993 | ........... H03H/9/145 |
| JP | 8-32398 | 2/1996 | ........... H03H/9/145 |
| JP | 8-154033 | 6/1996 | ............ H03H/9/25 |
| JP | 8-222990 | 8/1996 | ............ H03H/9/25 |

* cited by examiner

Primary Examiner—Thomas M. Dougherty
(74) Attorney, Agent, or Firm—McDermott, Will & Emery (57) ABSTRACT

Provided are a substrate for a surface-acoustic-wave device and a surface-acoustic-wave device, in which an intermediate layer for controlling crystal characteristics of a piezoelectric layer does not easily separate from a diamond layer.

A surface-acoustic-wave device substrate 20 and a surface-acoustic-wave device 10, according to the present invention, comprises a diamond layer 22, an intermediate layer 24 disposed on the diamond layer 22, and a piezoelectric layer 26 disposed on the intermediate layer 24, the piezoelectric layer 26 being made of $LiNbO_3$ or $LiTaO_3$, the intermediate layer 24 being made of AlN.

16 Claims, 4 Drawing Sheets

SURFACE ACOUSTIC WAVE DEVICE AND SUBSTRATE THEREOF

TECHNICAL FIELD

The present invention relates to a surface-acoustic-wave device that can be used in a high-frequency band, and a substrate suitably used for such a surface-acoustic-wave device.

BACKGROUND ART

A surface-acoustic-wave (SAW) device utilizing a SAW, which propagates in the surface of a solid body, satisfies properties required for an electromechanical functional part, such as ease in automating and simplifying its mounting operation, since it is small in size and light in weight, is superior in resistance against vibration and impact, and eliminates need for circuit adjustment.

Further, a SAW device has other various advantageous features, such as superior temperature stability, a long life, and superior phase characteristics. Therefore, SAW devices are widely employed as frequency filters, resonators, delay devices, Fourier transformers, convolvers, correlators, optoelectronic functional devices, etc.

Meanwhile, with a recent tendency toward multiple channels and higher frequency in the communication field including satellite communications and mobile communications, there has increased a demand for development of SAW devices that can be used in a high-frequency band (e.g., in a GHz band). A SAW device having a multilayered structure composed of diamond and piezoelectric layers has come into wide use for applications in such a high-frequency band. A method for manufacturing such a SAW device comprises the steps of forming a diamond film by vapor-phase synthesis on a base film made of a material such as Si, polishing the surface of the diamond film into a smooth surface, and forming a piezoelectric layer and interdigital transducers (IDTs) on the smooth surface, for example.

As for the piezoelectric layer, attention was given to a layer made of ZnO in the past. Recently, however, piezoelectric layers made of $LiNbO_3$ and $LiTaO_3$ have received attention. The piezoelectric layers made of $LiNbO_3$ and $LiTaO_3$ are superior in chemical stability, such as resistance against acids and alkalis, to those made of ZnO. In particular, $LiNbO_3$ has a higher electro-mechanical coupling coefficient ($K^2$) that is a guideline representing easiness in SAW excitation, and is suitably used in a wide-band filter for cellular phones, etc.

It has, however, been difficult to obtain good characteristics with a SAW device that is manufactured simply by forming a layer of $LiNbO_3$ or $LiTaO_3$ on a diamond layer formed by vapor-phase synthesis. Japanese Unexamined Patent Application Publication No. 8-154033 discloses a SAW device that has overcome the above problem. The SAW device disclosed in the Publication has been made based on the finding that the above-mentioned problem was attributable to improper crystal characteristics of $LiNbO_3$. The disclosed SAW device has, between a diamond layer and a $LiNbO_3$ layer, an intermediate layer made of ZnO, $Al_2O_3$, MgO or the like. The intermediate layer has the function of controlling crystal characteristics (such as crystallinity and crystal direction) of the $LiNbO_3$ layer so that the characteristics of the SAW device are improved.

However, a SAW device including a piezoelectric layer made of $LiNbO_3$ or $LiTaO_3$ has the following shortcoming. In the SAW device disclosed in Japanese Unexamined Patent Application Publication No. 8-154033, since the intermediate layer between the diamond layer and the $LiNbO_3$ layer is formed of an oxide such as ZnO or MgO, the intermediate layer and the diamond layer are apt to separate from each other.

The present invention has been made with the view of solving such problem, and its object is to provide a substrate for a surface-acoustic-wave device in which a diamond layer and an intermediate layer for controlling crystal characteristics of a piezoelectric layer do not separate easily from each other, and a surface-acoustic-wave device using such substrate.

DISCLOSURE OF INVENTION

As a result of conducting intensive studies to achieve the above object, the inventors have found that using AlN as an intermediate layer is very effective in increasing adhesion between a diamond layer and the intermediate layer.

Therefore, a substrate for a surface-acoustic-wave device according to the present invention is featured in comprising a diamond layer, an intermediate layer disposed on the diamond layer, and a piezoelectric layer disposed on the intermediate layer, and a $SiO_2$ layer disposed on the piezoelectric layer, the piezoelectric layer being made of $LiNbO_3$, the intermediate layer being made of AlN.

By so disposing the $SiO_2$ layer on the piezoelectric layer, it is possible to stabilize temperature characteristics of the surface-acoustic-wave device and to prevent a variation of center frequency. This is because the temperature coefficient of $SiO_2$ has a sign opposite to signs of the temperature coefficients of $LiNbO_3$ and diamond, and a canceling effect results.

Preferably, the intermediate layer is made of AlN having C-axis orientation. Since the piezoelectric layer located on the intermediate layer has a tendency to follow the crystal characteristics of the intermediate layer, the piezoelectric layer can easily be made to have C-axis orientation by causing the intermediate layer to have C-axis orientation.

Preferably, the intermediate layer has a thickness of 5 to 100 nm. The reason is that if the intermediate layer is thinner than the lower limit of the above range, the function of controlling the crystal characteristics of the piezoelectric layer tends to be insufficient, and if the intermediate layer is thicker than the upper limit of the above range, the intermediate layer is more apt to impede the characteristics of the underlying diamond layer.

Preferably, the piezoelectric layer is made of $LiNbO_3$ having C-axis orientation. By forming the piezoelectric layer of $LiNbO_3$ having C-axis orientation, piezoelectric characteristics can be improved.

Further, a surface-acoustic-wave device according to an embodiment of the present invention comprises the above-mentioned substrate for a surface-acoustic-wave device and exciting electrodes for exciting a surface acoustic wave.

In the surface-acoustic-wave device according to an embodiment of the present invention, since the intermediate layer is made of AlN as described above, and accordingly higher adhesion is achieved between the intermediate layer and the diamond layer in the substrate of the surface-acoustic-wave device, the resistance against vibration and impact can be improved.

In addition, the inventors have also found that using AlN as the intermediate layer is very effective in improving adhesion between the diamond layer and the intermediate layer in the case of forming the piezoelectric layer of LiTaO$_3$ as with the case of using LiNbO$_3$.

That is, a substrate for a surface-acoustic-wave device according to another embodiment of the present invention comprises a diamond layer, an intermediate layer disposed on the diamond layer, and a piezoelectric layer disposed on the intermediate layer, and a SiO$_2$ layer disposed on the piezoelectric layer, the piezoelectric layer being made of LiTaO$_3$, the intermediate layer being made of AlN.

By so disposing the SiO$_2$ layer on the piezoelectric layer, it is possible to stabilize temperature characteristics of the surface-acoustic-wave device and to prevent a variation of center frequency. This is because the temperature coefficient of SiO$_2$ has a sign opposite to the signs of the temperature coefficients of LiTaO$_3$ and diamond, and a canceling effect results.

Preferably, the intermediate layer is made of AlN having C-axis orientation. Since the piezoelectric layer located on the intermediate layer has a tendency to follow the crystal characteristics of the intermediate layer, the piezoelectric layer can easily be made to have C-axis orientation by causing the intermediate layer to have C-axis orientation.

Preferably, the intermediate layer has a thickness of 5 to 100 nm. The reason is that if the intermediate layer is thinner than the lower limit of the above range, the function of controlling the crystal characteristics of the piezoelectric layer tends to be insufficient, and if the intermediate layer is thicker than the upper limit of the above range, the intermediate layer is more apt to impede the characteristics of the underlying diamond layer.

Preferably, the piezoelectric layer is made of LiTaO$_3$ having C-axis orientation. By forming the piezoelectric layer of LiTaO$_3$ having C-axis orientation, piezoelectric characteristics can be improved.

Further, a surface-acoustic-wave device according to another embodiment of the present invention comprises the above-mentioned substrate for a surface-acoustic-wave device and exciting electrodes for exciting a surface acoustic wave.

In the surface-acoustic-wave device according to another embodiment of the present invention, since the intermediate layer is made of AlN as described above, and accordingly higher adhesion is achieved between the intermediate layer and the diamond layer in the substrate of the surface-acoustic-wave device, the resistance against vibration and impact can be improved.

REFERENCE NUMERALS 10 denotes a surface-acoustic-wave device, 20 a surface-acoustic-wave device substrate, 22 a diamond layer, 24 an intermediate layer (AlN), 26 a piezoelectric layer (LiNbO$_3$, LiTaO$_3$), 28 a SiO$_2$ layer, 30 an exciting electrode, and 32 a receiving electrode.

BEST MODE FOR CARRYING OUT THE INVENTION

Preferred embodiments of a substrate for a surface-acoustic-wave device and a surface-acoustic-wave device, according to the present invention, will be described below with reference to the accompanying drawings. Note that the same components are denoted by the same symbols and a description of the same components will not be repeated.

[First Embodiment]

Figure 5:
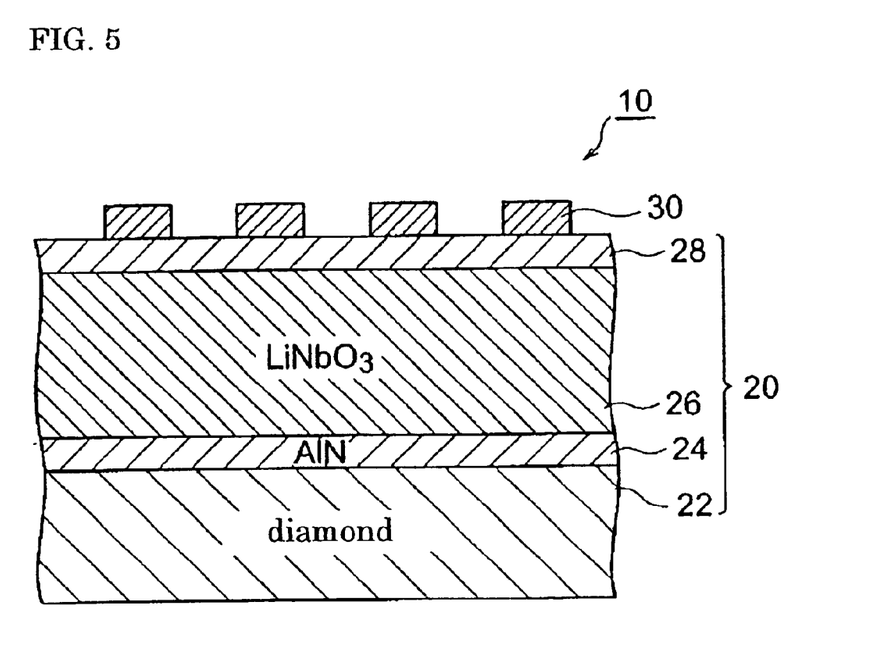
FIG. 5 shows another modification of the surface-acoustic-wave device of the first embodiment.

FIG. 5 is a sectional view showing a surface-acoustic-wave device (SAW device) 10 of this embodiment. The SAW device 10 is constituted by disposing, on a surface-acoustic-wave device substrate 20, exciting electrodes 30 for exciting surface acoustic waves (SAW). Also, the surface-acoustic-wave device substrate 20 comprises a diamond layer 22, an intermediate layer 24 formed on the diamond layer 22, and a piezoelectric layer 26 made of LiNbO$_3$ and formed on the intermediate layer 24, and a SiO$_2$ layer 28 formed on the piezoelectric layer 26.

The diamond layer 22 may be made of single-crystal diamond or poly-crystal diamond. The plane azimuth of the diamond layer 22 is not limited to a particular one and may be any one of (111), (100), (110), etc., for example, or these plane azimuths may exist in a mixed manner. Alternatively, those plane azimuths may exist in a mixed manner. The thickness of the diamond layer 22 is preferably not less than 5 μm and more preferably not less than 20 μm or not less than twice a wavelength, in view of easiness in the excitation of a surface acoustic wave. Though not illustrated in a drawing, the diamond layer 22 may be formed on a substrate made of a semiconductor such as Si, or metal, glass, ceramic, or the like.

The diamond layer 22 can be formed by any of various suitable methods. More specifically, there are a CVD (chemical vapor deposition) method, a microwave plasma CVD method, a PVD (physical vapor deposition) method, a sputtering method, an ion plating method, a plasma jet method, a flame method, a thermal filament method, etc.

The intermediate layer 24 may be formed directly on the diamond layer 22 which has been formed by any of those methods. To improve surface flatness or smoothness of the diamond layer 22, however, the surface of the diamond layer 22 is preferably polished using, e.g., an electrodeposited diamond grindstone.

The intermediate layer 24 has the function of controlling crystal characteristics of the piezoelectric layer 26 located on the intermediate layer 24, and is made of AlN in this embodiment. The inventors have found that adhesion between the diamond layer 22 and the intermediate layer 24 is improved by using AlN to form the intermediate layer 24.

The intermediate layer 24 made of AlN preferably has C-axis orientation. Because the piezoelectric layer 26 located on the intermediate layer 24 has a tendency to follow the crystal characteristics of the intermediate layer 24, the piezoelectric layer 26 is easily made to have C-axis orientation by causing the intermediate layer 24 to have C-axis-orientation. The orientation of the intermediate layer 24 can be evaluated based on, e.g., the θ–2θ method. For evaluating the orientation based on the θ–2θ method, a sample to be measured is first put in a sample holder of an X-ray diffractometer. Then, X-ray diffraction peaks of the sample are measured based on the θ–2θ method by using an X-ray diffraction pattern process. From the diffraction peaks thus measured, a total intensity ($I_C$) of all diffraction peaks corresponding to C-axis-oriented planes, i.e., (00 m) planes (m=integer not less than 1), and a total intensity ($I_T$) of all diffraction peaks are determined. A ratio ($I_C/I_T$) between the two total peak intensities is preferably not less than 80% and more preferably not less than 95%.

The thickness of the intermediate layer 24 can be selected as appropriate depending on the type of the underlying diamond layer 22, the size, the purpose of use, etc., but it is preferably in the range of 5 to 100 nm. The reason is that if the thickness of the intermediate layer 24 is smaller than the above range, the function of controlling the crystal characteristics of the piezoelectric layer 26 tends to become insufficient, and if the thickness of the intermediate layer 24 is larger than the above range, the electro-mechanical coupling coefficient ($K^2$) is reduced and accordingly it is difficult to excite a surface acoustic wave. Further, the thickness of the intermediate layer 24 is preferably selected such that the piezoelectric layer 26 made of $LiNbO_3$ has C-axis orientation with ease. Incidentally, the thickness of the intermediate layer 24 can be determined by observing a cut surface of the surface-acoustic-wave device substrate 20 with a film thickness measuring device, e.g., a scanning electron microscope (SEM).

The intermediate layer 24 preferably has an insulation level such that its resistivity is not less than about $10^4$ Ω·cm. The reason is that if the resistivity of the intermediate layer 24 is lower than such a level, the conductivity becomes high, which will cause power loss.

A method of forming the intermediate layer 24 is not limited to a particular one, and may be any of well-known various vapor-phase deposition processes such as CVD, PVD, sputtering and ion plating.

The piezoelectric layer 26, which is made of $LiNbO_3$ as mentioned above, may be a single crystal or poly-crystal. Also, the thickness of the piezoelectric layer 26 is not limited in particular, and can be selected as appropriate depending on the use of the surface-acoustic-wave device substrate 20 or the SAW device 10.

Further, to improve piezoelectric characteristics of the SAW device 10, the piezoelectric layer 26 is preferably formed of $LiNbO_3$ having C-axis orientation. Here, the crystal characteristics (such as crystallinity and crystal direction) of the piezoelectric layer 26 have a tendency to follow the crystal characteristics of the underlying intermediate layer 24. In other words, since the crystal characteristics of the piezoelectric layer 26 are controlled by the intermediate layer 24, the piezoelectric layer 26 can be more easily C-axis-orientated by causing the intermediate layer 24 to have C-axis orientation.

In the case of the C-axis-oriented piezoelectric layer 26, the ratio ($I_C/I_T$) between a total intensity ($I_C$) of diffraction peaks corresponding to C-axis oriented planes, i.e., (00 m) planes (m=integer not less than 1), and a total intensity ($I_T$) of all diffraction peaks, which are determined based on the above-mentioned θ–2θ method, is preferably not less than 80% and more preferably not less than 95%.

A method of forming the piezoelectric layer 26 made of $LiNbO_3$ is not limited to a particular one, and may be any of well-known various vapor-phase deposition processes such as sputtering, vapor deposition, CVD, laser abrasion, MOCVD (metal-organic chemical vapor deposition), and MBE (molecular beam epitaxy).

Figure 1:
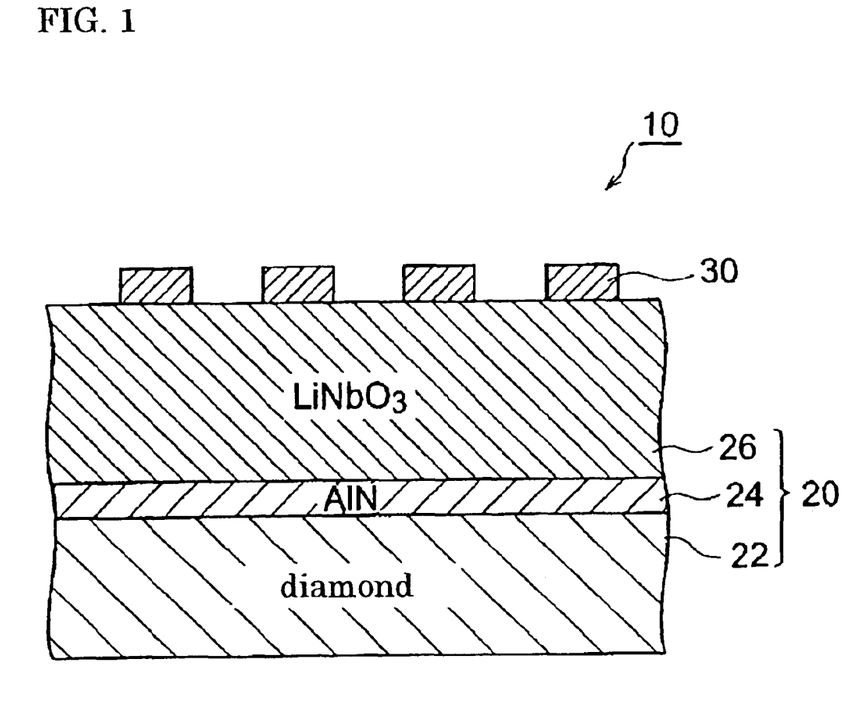
FIG. 1 is a sectional view showing a first embodiment of a surface-acoustic-wave device according to the present invention.
Figure 2:
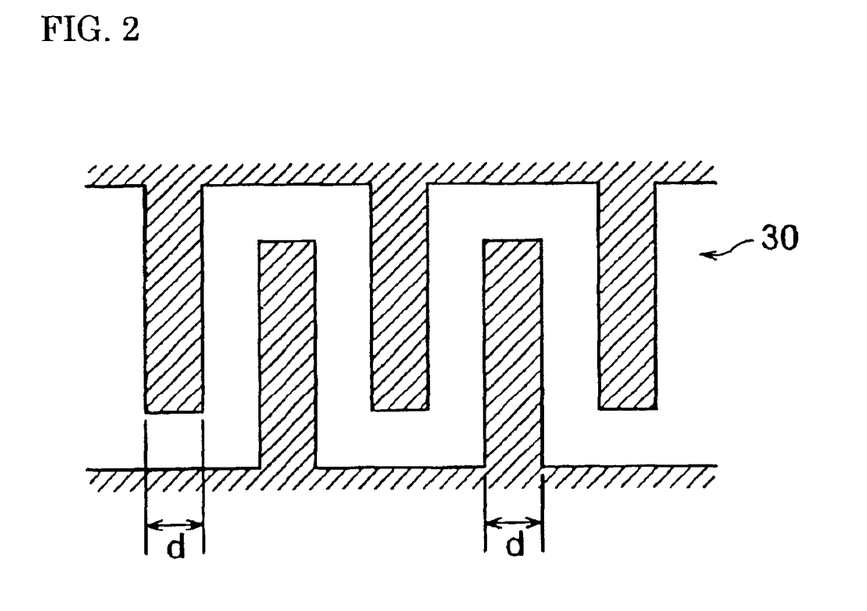
FIG. 2 is a plan view of exciting electrodes (single-type electrodes) provided on the surface-acoustic-wave device shown in FIG. 5.

Next, the exciting electrodes 30 will be described with reference to FIGS. 2 to 5. FIG. 2 is a plan view of the exciting electrodes provided on the SAW device 10 shown in FIG. 5. As shown in FIG. 2, the exciting electrodes 30 are constituted as the so-called single-type interdigital transducers. Materials of the exciting electrodes 30 are not limited to particular ones, but are preferably selected from Al, Al—Cu, Al—Si—Cu, and so on in consideration of machinability and cost.

The thickness of the exciting electrodes 30 may be set to any desired range so long as the exciting electrodes 30 can develop the function of exciting a surface acoustic wave, but it is preferably in the range of about 10 to 500 nm. The reason why the electrode thickness is preferably in the above range is that if the thickness of the exciting electrodes 30 is less than 10 nm, the resistivity becomes high, resulting in an increased loss, and if the thickness of the exciting electrodes 30 exceeds 500 nm, the mass effect of the electrodes upon producing SAW reflection is noticeable and the desired SAW characteristics would be impeded.

Figure 3:
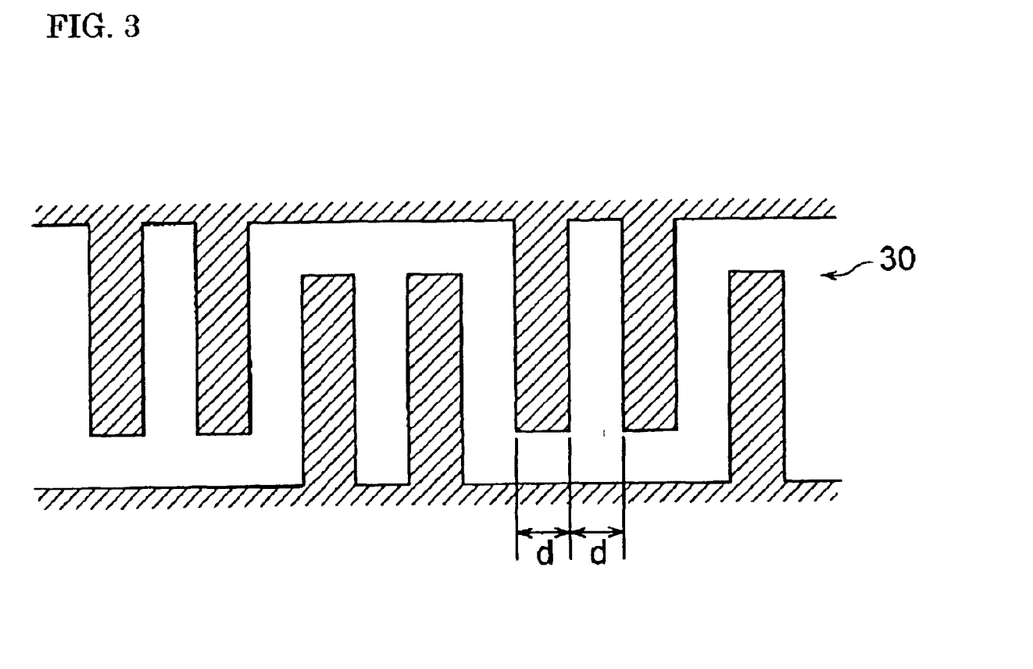
FIG. 3 shows a modification (double-type electrodes) of the exciting electrodes.

While, in this embodiment described above, the exciting electrodes 30 are formed as the single-type interdigital transducers, they may be constituted as the so-called double-type interdigital transducers shown in FIG. 3. Also, the exciting electrodes 30 may be disposed such that they are buried in the surface of the underlying layer (e.g., the surface of the piezoelectric layer 26). More specifically, by way of example, recessed grooves are formed in the surface of the piezoelectric layer 26, and a conductive material, such as Al, which constitutes the exciting electrodes 30, is wholly or partially buried in the grooves. By burying the whole or part of the exciting electrodes 30 in the underlying layer, the height of the exciting electrodes 30 can be made almost equal to that of the surface in which the exciting electrodes 30 are to be formed. Consequently, it is possible to reduce the effect caused by the exciting electrodes upon SAW reflection.

Figure 4:
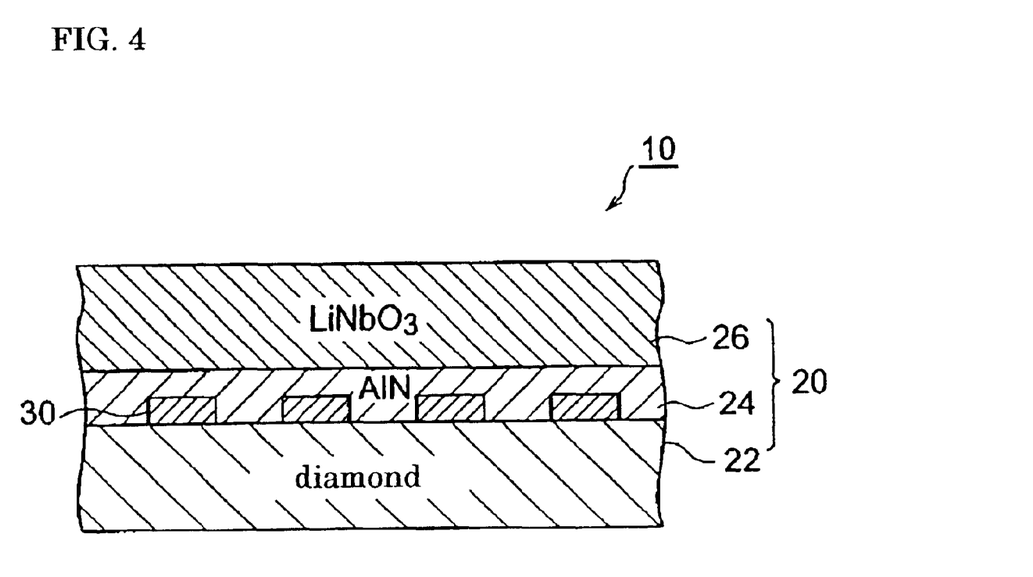
FIG. 4 shows a modification of the surface-acoustic-wave device of the first embodiment.

Instead of being formed on the $SiO_2$ layer 28 as shown in FIG. 5, the exciting electrodes 30 may be formed between the diamond layer 22 and the intermediate layer 24 as shown in FIG. 4, or may be formed between the intermediate layer 24 and the piezoelectric layer 26 (though not shown). However, from the viewpoint of not impeding the function of the intermediate layer 24 to control the crystal characteristics of the piezoelectric layer 26, the exciting electrodes 30 are preferably formed at the position shown in FIG. 5. Also, in the case where the exciting electrodes 30 are formed from a metal having a relatively low melting point, such as Al, etc., the exciting electrodes 30 are preferably formed on the piezoelectric layer 26 as shown in FIG. 5, rather than being formed between the diamond layer 22 and the intermediate layer 24 as shown in FIG. 4 in view of the fact that the temperature of the substrate increases to a level of, e.g., 700° C. during deposition to form the piezoelectric layer 26. In the case of forming the exciting electrodes 30 at the position shown in FIG. 4, the thickness of the exciting electrodes 30 is preferably smaller than that of the intermediate layer 24 and more preferably not greater than ½ (in particular not greater than ⅓) of that of the intermediate layer 24.

Further, the SAW device 10 of this embodiment may include a $SiO_2$ layer 28 formed on the piezoelectric layer 26. By so forming the $SiO_2$ layer 28 on the piezoelectric layer 26, it is possible to stabilize temperature characteristics of the surface-acoustic-wave device 10 and to prevent a variation of center frequency. This is because the temperature coefficient of the $SiO_2$ layer 28 has a sign opposite to the signs of the temperature coefficients of LiNbO$_3$ of the piezoelectric layer 26 and the diamond layer 22, whereby a canceling effect results. Note that, to stabilize those temperature characteristics, the SiO$_2$ layer 28 is preferably formed of an amorphous film.

Moreover, the SAW device 10 of this embodiment may include a short-circuit electrode (not shown) formed as required. The short-circuit electrode serves as an electrode for changing the SAW characteristics of the SAW device 10 by forming an equi-potential surface. The short-circuit electrode preferably has a planar form occupying an area which is substantially the same proportion as, for example, the exciting electrode 30. Also, the short-circuit electrode is preferably formed of a metal film, such as Al, Au, Al—Cu or Al—Si—Cu. Since the short-circuit electrode has the function different from that of the exciting electrode 30, it may be formed using a different material from that of the exciting electrode 30.

As in the case of the exciting electrode 30, the short-circuit electrode may be disposed at any position: on the piezoelectric layer 26, or between the diamond layer 22 and the intermediate layer 24, or between the intermediate layer 24 and the piezoelectric layer 26. However, the short-circuit electrode is preferably disposed on an opposite side of the exciting electrode 30 relative to the piezoelectric layer 26 such that the piezoelectric layer 26 is located between the short-circuit electrode and the exciting electrode 30. Further, from the viewpoint of not impeding the function of the intermediate layer 24 to control the crystal characteristics of the piezoelectric layer 26, the short-circuit electrode is preferably disposed on the piezoelectric layer 26 or between the diamond layer 22 and the intermediate layer 24.

The thickness of the short-circuit electrode is not limited in particular so long as the function of the short-circuit electrode can be developed, but it is preferably in the range of about 5 to 300 nm. The reason why the electrode thickness should preferably be in that range is that if the short-circuit electrode is thinner than 5 nm, it would be difficult to form an equi-potential surface, and if the short-circuit electrode is thicker than 300 nm, the short-circuit electrode more easily affects SAW reflection.

With the surface-acoustic-wave device 10 of this embodiment described above, since the intermediate layer 24 is made of AlN, adhesion between the diamond layer 22 and the intermediate layer 24 can be improved. Consequently, the surface-acoustic-wave device 10 has improved resistance against vibration and impact.

[Second Embodiment]

Figure 6:
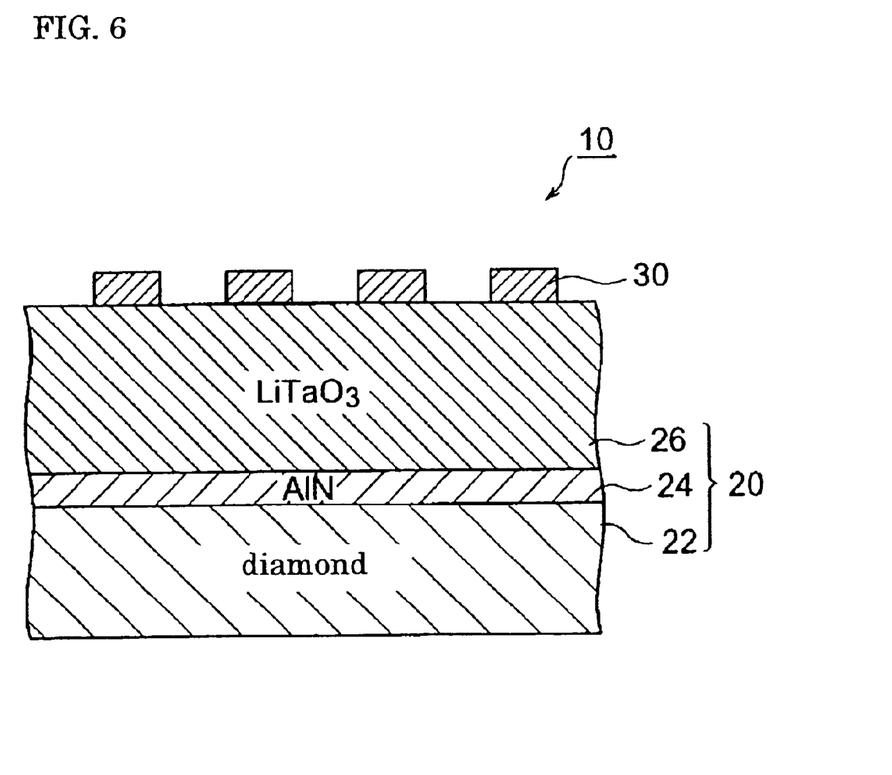
FIG. 6 is a sectional view showing a second embodiment of the surface-acoustic-wave device according to the present invention.

FIG. 6 shows a second embodiment of the surface-acoustic-wave device substrate 20 and the surface-acoustic-wave device 10 according to the present invention. This second embodiment differs from the first embodiment in that the piezoelectric layer 26 is made of LiTaO$_3$ instead of LiNbO$_3$. The diamond layer 22, the intermediate layer 24, the SiO$_2$ layer 28 and the exciting electrodes 30 can be set to have the same shape, size, material, orientation, etc. as those in the first embodiment, respectively, except for the piezoelectric layer 26.

Also in this embodiment, crystal characteristics of the piezoelectric layer 26 are determined depending on those of the underlying intermediate layer 24. In other words, as with the first embodiment, crystal characteristics of the piezoelectric layer 26 made of LiTaO$_3$ are controlled by the intermediate layer 24.

LiTaO$_3$ forming the piezoelectric layer 26 may be a single-crystal or poly-crystal However, to improve piezoelectric characteristics of the SAW device 10, the piezoelectric layer 26 is preferably formed of LiTaO$_3$ having C-axis orientation. In the case of the C-axis-oriented piezoelectric layer 26, the ratio ($I_C/I_T$) between a total intensity ($I_C$) of all diffraction peaks corresponding to C-axis oriented planes, i.e., (00 m) planes (m=integer not less than 1) and a total intensity ($I_T$) of all diffraction peaks, which are determined based on the above-mentioned θ–2θ method, is preferably not less than 80% and more preferably not less than 95%.

A method of forming the piezoelectric layer 26 made of LiTaO$_3$ is not limited to a particular one, and may be any of well-known various vapor-phase deposition processes such as sputtering, vapor deposition, CVD, laser abrasion, MOCVD (metal-organic chemical vapor deposition), and MBE (molecular beam epitaxy).

Although a graphic representation is omitted, the SiO$_2$ layer 28 is formed on the piezoelectric layer 26, and as with the first embodiment. Also, a short-circuit electrode may be formed in an appropriate place.

In the surface-acoustic-wave device 10 of this embodiment described above, since the intermediate layer 24 is made of AlN as in the first embodiment, the adhesion between the diamond layer 22 and the intermediate layer 24 can be improved. Consequently, the resistance against vibration and impact is also improved in the surface-acoustic-wave device 10.

EXAMPLES

The present invention will be described below more specifically in connection with Examples.

Example 1

A diamond film with a thickness of about 35 µm was grown on a Si base plate by microwave plasma CVD using a hydrogen gas with a 2% methane concentration. Film growth conditions in that step were as follows.
Microwave power: 150 W
Reactive gas : CH$_4$:H$_2$=2:100
Gas pressure : 5.33×10$^5$ Pa
Film forming temperature: 800° C.

The diamond film was mechanically polished using an electrodeposited diamond grindstone, whereby a multilayered structure of diamond/Si base plate with the diamond film having a thickness of 20 µm was obtained.

Then, an intermediate layer made of AlN was formed on the multilayered structure of diamond/Si base plate by RF magnetron sputtering. The intermediate layer had a thickness of 5 to 100 nm. Film growth conditions in that step were as follows.
RF power: 200 W
Film forming temperature: 450° C.
Target: Al
Atmosphere gas: N$_2$
Gas pressure: 1 Pa
Film thickness: 5 to 100 nm The thickness of the AlN intermediate layer was measured using a SEM. As a result of evaluating the orientation of the intermediate layers according to the θ–2θ method, the ratio ($I_C/I_T$) between a total intensity ($I_C$) of diffraction peaks corresponding to (00 m) planes (m=integer not less than 1) and the total intensity ($I_T$) of all diffraction peaks was in the range of 95 to 100%. However, when the thickness of the intermediate layer was not more than 5 nm, no peaks were found.

Subsequently, a piezoelectric film of LiNbO$_3$ was formed by sputtering on the multilayered structure of AlN intermediate layer/diamond film/Si base plate thus obtained, whereby a surface-acoustic-wave device substrate according to the present invention was obtained. In that step, the film thickness of LiNbO$_3$ was adjusted such that a total film thickness of the LiNbO$_3$ piezoelectric layer and the AlN intermediate layer was 670 nm. Growth conditions for the LiNbO$_3$ piezoelectric layer were as follows.

RF power: 150 W
Sputtering gas: Ar: O$_2$=50:50
Gas pressure: 1 Pa
Film forming temperature: 500° C.
Target: LiNbO$_3$ The thickness of the LiNbO$_3$ piezoelectric film was measured using a SEM. As a result of evaluating the orientation of the piezoelectric layers according to the θ–2θ method, it was confirmed that with respect to the piezoelectric layers which were grown on the AlN intermediate layer having a thickness of not less than 5 nm, the ratio ($I_C/I_T$) between the total intensity ($I_C$) of all diffraction peaks corresponding to (00 m) planes (m=integer not less than 1) and the total intensity ($I_T$) of all diffraction peaks was in the range of 80 to 100%, and that the LiNbO$_3$ piezoelectric layers were films all having C-axis orientation. This result is presumably attributable to the fact that crystal characteristics of the piezoelectric layer are controlled by the underlying AlN intermediate layer.

On the other hand, when the LiNbO$_3$ piezoelectric layer was formed on the AlN intermediate layer having a thickness of 3 nm, the formed piezoelectric layer showed no particular orientation.

Subsequently, an amorphous SiO$_2$ layer was formed on the LiNbO$_3$ piezoelectric layer. Subsequently, on the surface-acoustic-wave device substrate (SiO$_2$ layer/LiNbO$_3$ piezoelectric layer/AlN intermediate layer/diamond film/Si base place) thus obtained, an Al layer with a thickness of 50 nm was formed by resistance-heating vapor deposition at a deposition rate of 5 nm/sec (substrate temperature: room temperature).

Figure 7:
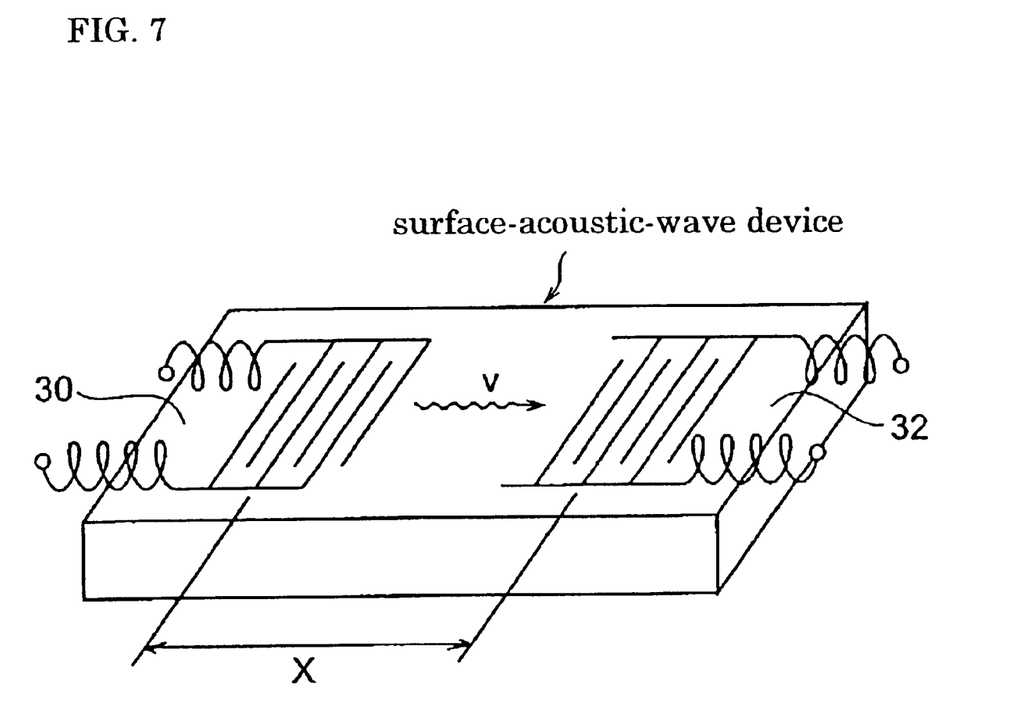
FIG. 7 is a schematic perspective view showing one form of the surface-acoustic-wave device according to the present invention.

Further, the thus-formed Al layer was patterned by photolithography to form single-type Al interdigital transducers (electrode width d=1.5 μm, electrode interval=1.5 μm, and period=6 μm) as shown in FIG. 2. A SAW device as shown in FIG. 7 was thereby completed. The Al electrodes thus formed were the exciting electrodes 30 for exciting a SAW and receiving electrodes 32 for receiving the SAW. The number of electrode pairs of the exciting electrodes 30 and the receiving electrodes 32 was set to 40, and a center-to-center distance X between the two types of electrodes was set to 600 μm. Also, wire-bonding of Al wires (diameter of 30 μm) was provided through pads to the exciting electrodes 30 and the receiving electrodes 32.

With respect to the SAW device having the intermediate layer made of AlN, which was fabricated as described above, and a comparative SAW device having the intermediate layer made of ZnO, which was fabricated separately, their respective strengths were measured for comparison. More specifically, the breaking mode and the strength were compared by pulling the wires connected to the respective exciting electrode pads of the SAW devices with a pull tester. As a result, in the comparative SAW device having the ZnO intermediate layer, a separation occurred at the interface between the diamond layer and the ZnO intermediate layer in pad areas when the tensile strength of about 2 kgf to about 4 kgf was applied. On the other hand, in the SAW device having the AlN intermediate layer, the wire was cut at its neck portion when the tensile strength of about 5 kgf to about 8 kgf was applied. From those results, it was confirmed that the SAW device with the intermediate layer made of AlN had higher adhesion to the diamond layer.

Example 2

In this example, a SAW device with the piezoelectric layer made of LiTaO$_3$ was fabricated Growth conditions for the LiTaO$_3$ piezoelectric layer were given below. Note that since the diamond layer, the AlN intermediate layer, and the exciting electrodes on the piezoelectric layer were formed under the same conditions as those in Example 1, they are not described here.

RF power: 150 W
Sputtering gas: Ar : O$_2$=80:20
Gas pressure: 1 Pa
Film forming temperature: 700° C.
Target: LiTaO$_3$ By using a SAW device having the LiTaO$_3$ piezoelectric layer and the AlN intermediate layer, which was fabricated as described above, and a comparative SAW device with the intermediate layer made of ZnO, which was fabricated separately, the strengths of those SAW devices were measured for comparison by pulling wires with a pull tester in a similar manner to that in Example 1. As a result, in the comparative SAW devices having the ZnO intermediate layer, a separation occurred at the interface between the diamond layer and the ZnO intermediate layer in pad areas when the tensile strength of about 2 kgf to about 4 kgf was applied. On the other hand, in the SAW devices having the AlN intermediate layer, the wires were broken at the neck portion when the tensile strength of about 5 kgf to about 8 kgf was applied. From those results, it was confirmed that the SAW device with the intermediate layer made of AlN had higher adhesion to the diamond layer.

The invention accomplished by the inventors has been described in detail in connection with the embodiments, but the present invention is not limited to the embodiments described above.

Industrial Applicability

In the substrate for the surface-acoustic-wave device and the surface-acoustic-wave device according to the present invention, using AlN to form the intermediate layer results in improved adhesion between the diamond layer and the intermediate layer as described above. Consequently, a separation is harder to occur at the interface between the diamond layer and the intermediate layer.

What is claimed is:

1. A substrate for a surface-acoustic-wave device, said substrate comprising a diamond layer, an intermediate layer disposed on said diamond layer, a piezoelectric layer disposed on said intermediate layer, and SiO$_2$ layer disposed on the piezoelectric layer, said piezoelectric layer being made of LiNbO$_3$, said intermediate layer being made of AlN.

2. A substrate for a surface-acoustic-wave device according to claim 1, wherein said intermediate layer is made of AlN having C-axis orientation.

3. A substrate for a surface-acoustic-wave device according to claim 2, wherein said intermediate layer has a thickness of 5 to 100 um.

4. A substrate for a surface-acoustic-wave device according to claim 2, wherein said piezoelectric layer is made of LiNbO$_3$ having C-axis orientation.

5. A surface-acoustic-wave device comprising exciting electrodes for exciting a surface acoustic wave and a substrate for a surface-acoustic-wave device according to claim 1.

6. A substrate for a surface-acoustic-wave device, said substrate comprising a diamond layer, an intermediate layer disposed on said diamond layer, a piezoelectric layer disposed on said intermediate layer, and SiO$_2$ layer disposed on the piezoelectric layer, said piezoelectric layer being made of LiTaO$_3$, said intermediate layer being made of AlN.

7. A substrate for a surface-acoustic-wave device according to claim 6, wherein said intermediate layer is made of AlN having C-axis orientation.

8. A substrate for a surface-acoustic-wave device according to claim 7, wherein said intermediate layer has a thickness of 5 to 100 um.

9. A substrate for a surface-acoustic-wave device according to claim 7, wherein said piezoelectric layer is made of LiTaO$_3$ having C-axis orientation.

10. A surface-acoustic-wave device comprising exciting electrodes for exciting a surface acoustic wave and a substrate for a surface-acoustic-wave device according to claim 6.

11. A surface-acoustic-wave device comprising exciting electrodes for exciting a surface acoustic wave and a substrate for a surface-acoustic-wave device according to claim 2.

12. A surface-acoustic-wave device comprising exciting electrodes for exciting a surface acoustic wave and a substrate for a surface-acousitc-wave device according to claim 3.

13. A surface-acoustic-wave device comprising exciting electrodes for exciting a surface acoustic wave and a substrate for a surface-acoustic-wave device according to claim 4.

14. A surface-acoustic-wave device comprising exiciting electrodes for exciting a surface acoustic wave and a substrate for a surface-acoustic-wave device according to claim 7.

15. A surface-acoustic-wave device comprising exciting electrodes for exciting a surface acoustic wave and a substrate for a surface-acoustic-wave device according to claim 8.

16. A surface-acoustic-wave device comprising exciting electrodes for exciting a surface acoustic wave and a substrate for a surface-acoustic-wave device according to claim 9.

* * * * *